United States Patent Office 3,657,383

Patented Apr. 18, 1972

3,657,383

PRINTING PLATE COMPOSITIONS

Julius L. Silver, Manchester, Conn., assignor to Union Carbide Corporation

No Drawing. Original application Dec. 9, 1963, Ser. No. 329,247. Divided and this application Nov. 12, 1970, Ser. No. 89,113

Int. Cl. C08g *37/18;* G03c *1/72*

U.S. Cl. 260—838 9 Claims

ABSTRACT OF THE DISCLOSURE

A printing plate base composition of (1) an association product of a normally water soluble ethylene oxide polymer and a heat fusible phenolic resin, and (2) 2 to 50 percent by weight of an oxidizing acidic compound based on the weight of the phenolic resin.

CROSS-REFERENCE TO RELATED APPLICATIONS

This patent application is a division of application Ser. No. 329,247 filed Dec. 9, 1963, now issued as U.S. 3,615,532 which was a continuation-in-part of applications Ser. Nos. 109,015 and 109,254 filed on May 10, 1961 and May 11, 1961, respectively, said latter two patent applications being now abandoned.

This invention relates to photomechanical reproduction and improvements therein. In a particular aspect, this invention relates to photosensitive resin compositions useful for the preparation of planographic printing plates.

At the present time virtually all printed copy is produced through the use of three basic types of printing plates. One type is a relief plate which prints from a raised surface. Another type is an intaglio plate which prints from a depressed surface. The third type is the planographic plate which prints from a flat surface which is neither raised above nor depressed below the adjacent and surrounding non-printing area.

Planographic printing plates have water-repellent (hydrophobic), oil-receptive (oleophilic) image areas; and water-receptive (hydrophilic) non-image areas. Offset lithography is the most widely known printing method which employs planographic printing plates. One type of lithographic plate is prepared by applying a thin coating of a diazo dye to a suitable support material, exposing the coating to the action of light passing through a negative of the picture to be printed causing the diazo coating to become crosslinked and hence water-repellent and oil receptive to the image area, and then washing away the unexposed, unreacted coating with a suitable developer. Since the plate support material is itself water-receptive, those portions of the plate from which the unreacted coating has been removed by the developer solution become the non-image area.

On diazo-type lithographic printing plates made as described above, all portions of the image area accept and print the same amount of ink per unit of area, and all parts of the non-image area totally reject the greasy printing ink. Consequently, in order to obtain gradations in tone or intermediate shades of color or tints, it has been generally necessary to use the so-called "half-tone dot structure" printing plate. In this process the printing plate, and the corresponding picture reproduced therefrom, are broken down into myriad dots by using half-tone negatives during exposure of the printing plate. While each individual dot prints with the same color intensity, the effect of tones and shades is created by virtue of different sizes of dots in the various parts of the printing plate and the printed picture produced therefrom. Diazo-type lithographic printing plates are not durable in that the image areas gradually abrade with normal press-room practices. Various lacquers and other coatings are sometimes employed to retard the rate of wearing down of image areas. There is also a tendency for metal base planographic printing plates to kink and scratch.

The non-image areas of the lithographic plates are the exposed grained zinc or aluminum surface of the base. The exposed metal areas are water-receptive. These exposed metal non-image areas suffer loss of water receptivity because corrosion and pitting occur.

Practically all metal base planographic printing plates depend on some graininess in the surface to enhance the water carrying ability of the non-image areas. This grain is deleterious to the reproduction of dot structures in halftone printing since the grain breaks up the dots themselves.

There is another planographic printing method, known as Collotype, which is unique among the presently known printing processes in that it provides continuous tone reproduction. In this latter process, the support material for the planographic plates is coated with a photosensitive gelatin which is initially soft and hydrophilic, but it becomes progressively harder and less hydrophilic when acted upon by light. Thus, when the coated plate is exposed to light through a negative, it appears that each area of the coating hardens in proportion to the amount of light which it requires and consequently it becomes proportionally less hydrophilic. As a result, the various parts of the exposed coating accept water in an amount inversely proportional to the intensity of light they received, and accept a complementary amount of ink in an amount directly proportional to the intensity of light which has acted upon the area.

Two deficiencies of the Collotype process stem largely from the inherent shortcomings of the photosensitive gelatin itself. Collotype printing plates can be used for only a few thousand reproductions due to the weakness of the gelatin. It is difficult to obtain prints of the same color density throughout a press run because the gelatin absorbs and releases water too rapidly, and the total water absorption capacity of the gelatin, which depends upon a highly critical "tanning" step, is not easily controllable nor reproducible.

It is therefore an object of the present invention to provide planographic printing plates which do not pit and corrode, and are more durable than metal lithographic plates.

It is another object of the present invention to provide planographic printing plates which are more flexible than metal base plates but do not kink and scratch in the manner of metal base plates.

It is still another object of the present invention to provide planographic printing plates which can be exposed and employed directly in lithographic printing operations without processing the plate with developing inks, image intensifiers, and the like.

It is a further object of the present invention to provide photosensitive resin compositions useful as photosensitive planographic plates, which are tougher and more durable than gelatin base plates employed in Collotype continuous tone printing.

It is another object of the present invention to provide tack-free planographic printing plates upon which can be formed continuous tone exposures and then employed directly in printing operations without any developing procedure.

It is another object of the present invention to provide continuous tone planographic plates which permit control of color density and uniformity of reproduction.

It is another object of the present invention to provide planographic printing plates which can be used to reproduce pictures with good color purity and well-defined boundaries by the half-tone technique.

Other objects and advantages of the present invention will become apparent to those skilled in the art from the accompanying description and disclosure.

In accordance with the present invention it has been found that one or more of the aforementioned objects are accomplished through the utilization of a printing plate base composition comprising (1) the association product of a normally solid water soluble ethylene oxide polymer and a phenolic resin formed by the condensation of a phenolic compound and an aldehyde and (2) a non-oxidizing acidic compound.

The printing plate base composition can be photosensitized by incorporating a photosensitizing agent directly or coating the surface of the composition with a solution of a suitable photosensitizing agent. When the latter technique is used, it is, of course, desirable that the printing plate base composition be formed into a suitable printing surface.

The printing plate can consist solely of the plastic base, with or without fillers such as cotton flock, calcium carbonate, silica, and the like, or lubricants such as mineral oil, stearic acid, oleic acid and the like. The printing plate can also be constructed in the form of a laminate. The plastic base material readily presses into smooth sheets of any thickness. The sheeted plastic material can be bonded directly by heat and pressure to cloth, paper, plastic, metal, and the like. An adhesive can be used if the strength of the bond is not adequate with certain materials. A particularly useful type of plate construction is the bonding of glass cloth between two sheets of the sheeted plastic material. One of the many advantages of this type of plate construction is the ability to use both sides of the plate for printing purposes.

The ethylene oxide polymer component of the compositions of this invention is selected from the resinous ethylene oxide polymeric materials having an average molecular weight in the range of from about 50,000 to about 10,000,000, which are readily soluble in water. The term "ethylene oxide polymers" refers to polymers possessing the repeating unit ($CH_2$—$CH_2O$—) as represented by the class of commercial Polyox resins; and the term is intended to include water soluble ethylene oxide polymer resins wherein ethylene oxide is the predominant monomer polymerized therein but which can also contain polymerized residues of other olefin oxides as exemplified by copolymers and terpolymers of ethylene oxide with other copolymerizable monomers containing single epoxide groups such as propylene oxide, butylene oxide, styrene oxide and the like. Poly(ethylene oxide) homopolymer is however preferred as the ethylene oxide polymer resin and shall be used hereinafter as representative of these resins.

The phenolic resin component of the compositions of the present invention are the heat fusible condensation products of a phenol with an aldehyde. Such condensation products are divided into two classes, resoles and novolaks, either of which can be used in this invention as shown hereinafter. These two types of resins are discussed in order below. Both of these classes of phenolic resins will form an association with etheylene oxide polymers, and a suitable photosensitizing compound, a photosensitive composition and when placed on a support as a thin film and cured, will comprise a planographic printing plate suitable for reproduction in continuous tone for large numbers of faithfully detailed copies.

While these phenolic resins are in the fusible form when making the association product (as hereinafter more clearly set forth) the fusible condition is not necessarily a critical condition of the association product, in which it is possible for a portion or all of the phenolic resin component to be fully advanced to the cured state.

The fusible resole phenolic resins can advance upon heating to a degree of cure and polymerization to attain a completely insoluble state. These insoluble phenolics cannot be used in the preparation of the present compositions but are believed to be present in the cured printing plate compositions of this invention. In the preparation of the present compositions only those heat fusible phenolic resins which are soluble in water, alkali or organic solvents such as acetone, ethanol and the like and which are sufficiently fusible to permit admixture and association with the ethylene oxide polymers can be used. These resins include those resole phenolic resins which have not cured to a degree of insolubility as well as the novolak resins discussed below.

Resole resins

Resole resins, are produced by the condensation of phenols and aldehydes under alkaline conditions. Resoles differ from novolaks in that polynuclear methylol-substituted phenols are formed as intermediates in resoles. A resole produced by the condensation of phenol with formaldehyde most likely proceeds through an intermediate having the following illustrated type structure:

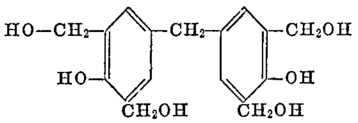

In a typical synthesis, resoles are prepared by heating one mole of phenol with 1.5 moles of formaldehyde under alkaline conditions.

The resole resins are prepared by the condensation of phenol with formaldehyde or, more generally, by the reaction of a phenolic compound, having two or three reactive aromatic ring hydrogen positions, with an aldehyde or aldehyde-liberating compound capable of undergoing phenol-aldehyde condensation. Illustrative of phenolic compounds are cresol, xylenol, ethylphenol, butylphenol, isopropylmethoxyphenol, chlorophenol, resorcinol, hydroquinone, naphthol, 2,2-bis(p-hydroxyphenyl) propane, and the like. Illustrative of aldehydes are formaldehyde, acetaldehyde, acrolein, crotonaldehyde, furfural, and the like. Illustrative of aldehyde-liberating compounds are for example, paraformaldehyde, Formalin and 1,3,5-trioxane. Ketones such as acetone are also capable of condensing with phenolic compounds, as are methylene engendering agents such as hexamethylenetetramine.

The condensation of phenolic compound and aldehyde is conducted in the presence of alkaline reagents such as sodium carbonate, sodium acetate, sodium hydroxide, ammonium hydroxide, and the like. When the condensation reaction is completed, if desired the water and other volatile materials can be removed by distillation, and the catalyst neutralized.

Novolak resins

The novolak resins are prepared in a manner similar to that used to prepare the resole resins. The distinguishing exception in this preparation is however that the reaction is conducted in an acidic media, instead of an alkaline media as is the case with the resoles. When less than six moles of formaldehyde are used per seven moles of phenol the products are permanently fusible and soluble. These are the novolak resins. The novolaks have a different structure than the resoles as is illustrated by the novolak condensation products of phenol with formaldehyde:

a)

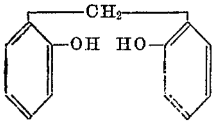

b)

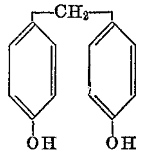

c)

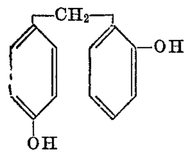

The novolaks can be further reacted with formaldehyde or with a methylol yielding compound such as hexamethylene tetramine, to a state of cure which is similar in the nature to the curing pattern of the resoles.

In a typical synthesis novolaks are prepared by heating one mole of phenol with 0.5 mole of formaldehyde under acidic conditions. The temperature at which the reaction is conducted is generally from about 25° C. to about 175° C.

The reactants which can be used in the preparation of the novolaks are the same as those used in the preparation of the resoles which are described and listed above.

While as previously stated both the resole resins and the novolak resins can be employed in the compositions of the present invention, it is preferred to use the resole resins, as printing plates formed from compositions utilizing them give sharper prints and have a longer printing life.

The most suitable fusible resole resins are those which are insoluble in water but readily soluble in conventional organic solvents such as methyl ethyl ketone, acetone, methanol, ethanol, and the like. Resole resins having a particularly desirable combination of properties are those which have an average molecular weight in the range between about three hundred fifty and six hundred. It is believer that these resole resins contain an average of at least one methylol group per aromatic nucleus.

The acidic compound of the plastic base composition is non-oxidizing and exhibits a pH of less than 7 and preferably less than 6 i.e., those compounds which range in acid strength from weak acids such as acetic acid to strong acids such as hydrochloric acid. Suitable acidic compounds include mineral acids such as sulfuric acid, phosphoric acid, boric acid, hydriodic acid, hydrochloric acid, hydrobromic acid, hydrofluoric acid, and the like; carboxylic acids such as formic acid, acetic and bromoacetic acid, toluenesulfonic acid, trichloroacetic acid, oxalic acid, malonic acid, succinic acid, adipic acid, tartaric acid, lactic acid, citric acid, 1,2,4-butanetricarboxylic acid, tricarballylic acid, aconitic acid, glutaconic acid, pyruvic acid, glyoxalic acid, acetoacetic acid, levulinic, benzoic acid, phthalic acid, terephthalic acid, salicyclic acid, anisic acid, mellitic acid, glycine, abietic acid, polyacrylic acid, and the like; and acid salts such as cadmium chloride, zinc chloride, aluminum chloride, calcium chloride and the like.

The polycarboxylic acids, oxalic acid in particular have been found to give outstanding results. Polymeric polycarboxylic acids such as polyacrylic acid have the advantage of imparting beneficial properties to the compositions as derived from their resinous nature.

The ratio of components in the photosensitive compositions must be within specific limits in order to obtain satisfactory results when the compositions are employed in the preparation of planographic printing plates. The quantity of ethylene oxide polymer in the compositions can vary between about 0.2 and 3 parts by weight per part of phenolic resin, with the preferred ratio being between about 0.6 and 1.8 parts of ethylene oxide polymer per part of phenolic resin. The quantity of photosensitive substance used when incorporated in the compositions can vary between about 0.08 and 0.2 part by weight per part of phenolic resin, with the preferred ratio being between about 0.1 and 0.13 part of sensitizer per part of resole resin. The ratio of these components varies depending on the particular characteristics of the respective components, the presence or absence of fillers and other similar materials, and the particular combination of properties sought in the compositions.

The acidic component is generally employed in a quantity which is sufficient to eliminate tackiness when the photosensitive composition is sheeted on a calender or shaped in the form of a printing plate. The minimum quantity of the acidic component sufficient to reduce tackiness depends on many factors, such as the acid strength of the acidic component, the particular resole resin component employed, the ratio of resole resin to ethylene oxide polymer resin, and the like. The quantity of acidic component should be sufficient to allow pressing of the photosensitive composition into a tack-free printing plate. The quantity of acidic component will generally vary in the range between 2 and 50 weight percent, based on the weight of phenolic resin, and more usually will vary in the range between 10 and 25 weight percent.

Two general methods may be employed to prepare the photosensitive compositions of the present invention. In the first method, the ethylene oxide polymer resin component is mixed with the phenol and aldehyde reaction mixture employed to prepare the phenolic resin. In the second method, the phenolic resin is prepared separately and then admixed with the ethylene oxide polymer resin on a two-roll mill or in a Banbury blender in the presence of some water.

In the first method, the ethylene oxide polymer is added to the aqueous solution of phenol, aldehyde and catalytic agents in the reaction vessel. After a reaction period of between about one-half hour to three hours, volatile components of the reaction mixture are distilled until the temperature of the reaction mixture rises to about 90° C. to 100° C., and the resulting product is a gel-like mass. This material is then milled on a two-roll mill set at about 100° C. until enough water is removed to yield a rubbery sheet. Then the material is milled further with addition of a water solution of acidic component and photosensitive component. Milling is continued until the materal is fairly dry and a thin sheet can be stripped off the mill.

The second method is preferred since it permits the use of previously prepared phenolic resin and it also allows better control of the ratio of ethylene oxide polymer to phenolic resin. Generally, if a presensitized printing plate is desired, the ethylene oxide polymer resin, photosensitive component and acidic component are mixed with enough water to form a paste and is then charged to a two-roll mill which has one roll set at about 100° C. and the other at about 90° C. As the mixture mills into a sheeted material, the resole resin is slowly added and the action of the heat and milling drives off most of the water to produce a tough and flexible sheet.

The base material prepared by either of the two methods described above can be readily pressed into smooth sheets of any thickness. A convenient pressing cycle is to set the press platens at a temperature of 130° C. and a pressure of about 300 p.s.i. and to press for a period of about three minutes.

The material can also be calendered to yield flat sheets which can then be pressed. The calendering operation is most conveniently performed by setting the calender roll temperatures at progressively lower temperatures from roll to roll. Calendering is advantageous in that the material is fairly uniform in gauge before pressing which permits a shorter press cycle.

The pressing operation forms the plate surface and it also tends to modify the composition so as to eliminate tackiness. The temperature at which the material is pressed can vary from about 110° C. up to about 190° C. for best results.

The photosensitizing agent which is used to photosensitize the compositions of this invention are those which when acted upon by light energy at ambient temperatures is activated, and in its activated form becomes capable of reaction with the resinous components of the printing plate base composition thereby "hardening" the portion of the plate exposed to light.

Illustrative of the photosensitive agents contemplated are the light-sensitive diazo and diazonium compounds (diazoliths), azides, and water-soluble hexavalent chromium compounds. As used herein, the term "diazo" is meant to include diazonium and azido compounds. Illustrative of the classes of photosensitizers are rosin derivatives of diazonaphthol- and diazophenol-sulfonamides; ortho-quinone-diazide; condensation products of diazodiarylamine and formaldehyde; 4,4'-diazidostilbene-2,2'-disulfonic acid salts; azidostyrylketones of the type described in French Pat. No. 886,716 such as 4-azidobenzalacetone-2-sulfonic acid salts; 1,5-diazido-naphthalene-3,7-disulfonic acid salts; 4-azido-naphthalene-1,8-dicarboxylic acid salts; 4,4'-diazido-diphenylmethane-3,5-dicarboxylic acid salts; 2-diazo-1-hydroxynaphthalene-5-sulfonic acid salts; para-diazodialkyl-anilines; para-diazophenylmorpholine; para-diethyl amino benzene diazonium fluoborate; 2-methyl benzene diazonium fluoborate; para-fluorophenyl diazonium fluoborate; 1,5-naphthalene tetrazonium fluoborate; ammonium chromate; ammonium bichromate; sodium chromate; sodium bichromate; potassium chromate; potassium bichromate; the halogen releasing type of photosensitizing agents such as the hydrogen halides and the alogenated paraffins.

The choice of a particular sensitizer can be predicated upon the mode of application. For example, if the photosensitizer is to be incorporated into the printing plate base composition, it is generally desirable to select a photosensitive agent having a relatively low volatility, although this is not critical, as the process conditions under which the compositions are pressed into sheets involve heating the compositions, and volatile sensitizers would be partially lost. If however the photosensitizing agent is to be applied as a solution coating, solubility in a particular solvent can be determining. When the coating technique is to be used to photosensitize the printing plates of this invention the halogenated paraffins have been found preferable.

Particularly preferred compounds of this class of photosensitizers are alkyl and alkylene iodides. The photosensitizing ability of the various iodides is a function of quantum yield,[1] which in turn depends on the chemical structure of the respective iodides. Generally, the quantum yield increases as the number of iodine atoms in the compounds increases, and as the length of the hydrocarbon chain increases. The quantum yield is also higher if the iodine atoms are on a tertiary carbon atom rather than a primary or secondary carbon atom. On this basis, the photosensitizing ability of various iodides, in the order of increasing efficiency, is exemplfied by the following sequence:

$$CH_3I < CH_3CH_2I < CH_3(CH_2)_2I < CH_3(CH_2)_3I < (CH_3)_3CI < CH_2I_2 < CHI_3$$

Iodoform is a particularly outstanding photosensitizing agent in the practice of the present invention.

The photosensitive component of the composition can be included as a component in the preparation of the printing plate material as described in the above methods, or it can be withheld until the composition has been formed into a sheet or shaped into a printing plate and then applied in solution form to the surface of the plate. The photosensitive component is conveniently coated on the plates in this manner as a solution in solvents such as benzene, carbon disulfide, diethyl ether, ethyl acetate, methanol, ethanol, acetone, and the like. The concentration of the photosensitizer in the solvent will control the thickness of the coating and this will influence the time needed for satisfactory exposure in the development of the printing plate. A preferred photosensitizer coating solution consists of between about 1 percent and 10 percent iodoform in acetone. The coating can be applied by wiping on the solution with a cloth, or by pouring onto the plate in a whirler.

The sheeted photosensitive composition can be exposed, developed and used directly in a printing operation. It has been found convenient to laminate or glue the sheeted photosensitive composition onto a substrate. The photosensitive composition can be bonded directly by heat and pressure to cloth, paper, grained zinc, and the like. A very satisfactory method is to form a sandwich of two sheets of the photosensitive composition with a layer of glass cloth in between. The materials bond together through the open spaces in the glass cloth weave. One advantage of this particular type of plate is that both sides of the plate can be used as printing surfaces.

The printing plate is exposed to a light source through a transparent pattern (e.g., a negative) to form an image on the photosensitive surface. The negative can be either the continuous tone or half-tone type. The light source can be sunlight, carbon-arc light, mercury vapor light or other light source of suitable intensity.

It appears that the image is formed due to the fact that each infinitesimal area of the coating hardens in proportion to the amount of light it receives and consequently becomes proportionally less hydrophilic. As in Collotype printing plates, the various parts of the exposed coating accept water in an amount inversely proportional to the quantity of light they receive. These areas accept a complementary quantity of ink directly proportional to the intensity of light which acted upon the coating. Those areas which received no light absorb a maximum quantity of water during printing and completely repel the greasy ink. Those areas exposed to sufficient light to render them completely hydrophobic absorb the maximum amount of ink, and those areas which during exposure received intermediate amounts of light accept an intermediate amount of ink in proportion to the intensity of light they received. This apparent mechanism of acceptance and rejection of water and ink proportional to light exposure provides the continuous tone nature of the printing plate image and the subsequent reproductions.

Printing plates produced according to the practice of the present invention are capable of providing excellent reproductions in printing processes. The disadvantages of half-tone dot structure techniques described hereinbefore are avoided. The photosensitive compositions of the present invention form printing plates which are tougher and more durable than the gelatin base plates heretofore used in continuous tone printing. The invention photosensitive compositions are also more versatile than the gelatin base plates since the properties of toughness and water receptivity may be readily and reproducibly controlled simply by varying the weight ratio of ethylene oxide polymer to phenolic resin component. Furthermore, the invention compositions absorb and release water more slowly than does gelatin. These more favorable water absorption characteristics permit easily controllable water capacity and provide improved control of color density during a press run. Further, no development of the continuous tone image on the plates after exposure to light is required, thus eliminating the necessity for special chemicals and the necessity for complicated development techniques which must be rigidly controlled within narrow limits.

The photosensitive compositions of the present invention are especially useful as lithographic half-tone and continuous tone printing plates. The photosensitive composition can be handled as solids without the necessity of em-

[1] Quantum yield refers to the number of molecules reacting chemically per photon of light absorbed.

ploying solution coating methods. The photosensitive compositions can be milled or calendered into films or sheets, and these can be used directly, or they can be laminated or glued to form various printing plate configurations.

While not wishing to be bound by any theory of mechanisms, it is believed that the outstanding characteristics of the photosensitive compositions of the present invention as employed in the preparation and use of half-tone and continuous tone planographic printing plates are mainly due to the "association" or "complex" formation between the phenolic resin component and the ethylene oxide polymer component. The term "association" refers to the interaction which provides the binding force between the ethylene oxide polymer component and the phenolic resin component. It is believed that the interaction involves one or more diverse mechanisms such as hydrogen bonding, electrostatic bonding, secondary valence forces, and the like. It appears that the phenomenon concerning hydrogen bonding can best explain the nature of the interaction. The "associating" or "complexing" interaction between the phenolic resin component and the ethylene oxide polymer component in the photosensitive compositions might be visualized in the following manner:

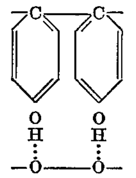

The "association" of the resole resin component and the ethylene oxide polymer component causes the formation of a tough, hydrophilic material when sheeted or molded. The water receptivity of this "association" product declines as the phenolic resin "advances," that is, increases in molecular weight and/or in degree of cross-linking on exposure to light, and the methylol content of the resole resin decreases. Radicals released by the action of light on the photosensitive substance in the composition (for example, iodine radicals released from iodoform) react with the resole phenolic resin to produce intermediate chemical products. These products presumably react with each other as well as with unactivated phenolic molecules to produce "advanced" high molecular weight phenolic derivatives of lower methylol content. This causes the water receptivity of the phenolic resin-ethylene oxide polymer coating to decline in proportion to the radicals produced, which is in turn proportional to the intensity of the light received by a particular portion of the coating during exposure.

The above-postulated mechanisms of interaction are merely theoretical and should not be construed as limiting thereto. Other theories or reasons may equally well explain the true nature of the interaction.

The plastic printing plates of the present invention are superior to the standard metal-base printing plates employed in the lithographic industry. The printing plates of the present invention require no processing in order to develop the exposed plate. If desired, the process can be confined simply to removing excess sensitizer. However, this is not necessary since the action of the molletons of the printing press will effectively remove any excess sensitizer. The printing plates of the present invention are tough and durable and there is no difficulty with the image areas wearing away when subjected to normal pressroom practices. Since the plates can be prepared with a paper or plastic substrate, they are more flexible than metal-base plates and this permits more latitude in storage and greater convenience in mounting on printing presses. The printing plates will not kink and they are extremely scratch resistant. Unlike conventional metal-base plates, the non-image areas are not metal. Hence, there is no difficulty with pitting and corrosion, and because there is no graininess, it is possible to print perfect dots in half-tone printing. This particular advantage is illustrated by the fact that negatives of screening of three hundred lines per inch or higher can be employed.

Another significant difference between the printing plates of the present invention and the conventional lithographic diazo printing plates is the fact that the invention plates have a one-phase printing surface while the conventional plates after they are developed have two phases, i.e., the diazo decomposition product phase and the exposed metal-base phase. The plastic-base printing plates of this invention are useful in offset lithographic printing, and in direct printing with standard dampening and inking systems.

In another useful application of the invention plastic-base compositions, ink containing a photosensitizer can be typed onto the plastic-base composition which is suitably flexible, and then the plate is exposed and employed directly for running off copies.

The following examples will serve to illustrate specific embodiments of the invention.

ILLUSTRATION I

This illustration exemplifies the preparation of conventional phenolic resins useful in the practice of the present invention.

(a) Phenol-formaldehyde resole resin

A mixture consisting of 1 mole of phenol, 3 moles of paraformaldehyde, 6 moles of water and 0.3 mole of sodium acetate trihydrate is refluxed at atmospheric pressure for a period of time between about two and one-half hours and three and one-half hours until the solution becomes cloudy. Two distinct phases begin to form as the resin precipitates from the refluxing mixture. Heating is continued for an additional five minutes and the hot mixture is then poured into water to completely precipitate the resin. The solid resin is recovered by filtration or decantation or other suitable separation method and washed thoroughly with water. The resin is dissolved in a suitable solvent such as methyl ethyl ketone, and anhydrous sodium sulfate is added to dry the solution. The water free solution is recovered by filtering out the sodium sulfate.

(b) Meta-cresol-formaldehyde resole resin

Meta-cresol, paraformaldehyde and sodium acetate trihydrate in a molar ratio of 1:2.5:0.3, respectively, are mixed in water to form a dilute slurry (about 200 milliliters of water per mole of meta-cresol). This mixture is refluxed at atmospheric pressure until resin begins to precipitate, which is normally about a twenty-minute reaction period. The heating is continued an additional five minutes, and the reaction mixture is poured into cold water to completely precipitate the resin. An anhydrous solution of the resin in methyl ethyl ketone is prepared in the same manner as above.

(c) Resorcinol-formaldehyde resole resin

A mixture of resorcinol, sodium sulfate and Formalin (37 percent solution of formaldehyde in water) in a molar ratio of about 1:0.2:0.8, respectively, is dissolved in water (about 100 milliliters of water per mole of resorcinol). The reaction mixture is heated on a steam bath until the solution turns cloudy, then it is poured into cold water to completely precipitate the resin product. The resin is recovered and prepared as an anhydrous solution in methyl ethyl ketone in the manner described above.

(d) Phenol-formaldehyde novolak resin

One hundred grams of phenol is dissolved in 69 grams of 37 percent Formalin solution and about 0.55 grams of oxalic acid is added. This mixture is refluxed at a temperature of about 80° C. for a period of about 6 hours at the end of which period the solution becomes cloudy. Water is then distilled from the reaction mixture until the temperature of the resinous mass reaches about 150°

C. The resin is then discharged from the reaction vessel and allowed to cool. At room temperature the cooled resin is brittle and is readily pulverized to a powdery state.

EXAMPLE 1

This example illustrates the preparation of a photosensitive composition of this invention and its application in planographic printing.

A resole resin was prepared by refluxing a mixture of 100 grams of meta-cresol, 90 grams of 37 percent Formalin, 6 grams of hexamethylenetetramine and 50 grams of water for a reaction period of thirty-five minutes under partial vacuum. The mixture was distilled in vacuo until the flask temperature rose to 95° C. The product residue was recovered from the still and pulverized.

A paste of 30 grams of poly(ethylene oxide) (molecular weight in the range between about four million and eight million) and 100 grams of water were milled on a two-roll mill (one roll at 100° C., and the other at 90° C.) until a sheet was formed. 35 grams of the powdered resole resin was added and milling was continued until a homogeneous product was formed. 15 grams of oxalic acid was added in a water slurry and milling was again continued until a homogeneous sheet was obtained. 2 grams of iodoform in a solution of acetone was added and milling was continued until a homogeneous sheet was formed. The sheet was removed from the mill and pressed for one minute at a temperature of 130° C. at 500 p.s.i. pressure onto a sheet of heavy clay coated paper.

The photosensitive composition was covered with a continuous tone photographic negative, and exposed for five minutes at two feet with a 15 ampere carbon-arc lamp. The exposed plate was mounted on a Multilith Model 1250 offset press and excellent printing was obtained. The same results were obtained when a half-tone negative was employed for the exposure.

In a similar manner, other photosensitive compositions were prepared and sheeted employing stannic chloride, succinic acid, phosphoric acid and hydrochloric acid in place of oxalic acid.

Similar results are obtained when bromoform, methyl iodide and other halogen releasing halocarbons are used as sensitizers instead of iodoform.

EXAMPLE 2

30 grams of poly(ethylene oxide) (approximate molecular weight in the range between three million and four million) was made into a paste with about 100 grams of water containing 5 grams of oxalic acid. The paste was milled on a two-roll mill (one roll at 100° C. and the other at 90° C.) until a homogeneous sheet was formed. Then 20 grams of powdered phenolic resin [2] was slowly added. Milling was continued until the material was homogeneous and fairly dry. It was stripped off the mill in a continuous sheet.

The sheeted resinous material was contacted with kraft paper which, in turn, was pressed on a sheet of polyethylene. The materials were pressed together for three minutes at 300 p.s.i. at a temperature of 150° C. The resulting product was a permanently bonded laminate of sufficiently good creep resistance to be employed for printing in good register on a Harris (LUH–120) printing press.

The plastic laminate plate material was sensitized by whirling on a 5 percent solution of iodoform in acetone. The plate was covered with a continuous tone photographic negative, and exposed for five minutes at two feet with a 15 ampere carbon arc lamp. The exposed plate was mounted on a Multilith Model 1250 offset press and excellent printing was obtained. The same results were obtained when a halftone negative was employed for the exposure of the plate.

EXAMPLE 3

30 grams of poly(ethylene oxide) (approximate molecular weight in the range between three million and four million) was made into a paste with about 100 grams of water containing 5 grams of oxalic acid. The paste was milled on a two-roll mill (one roll at 100° C. and the other at 90° C.) until a homogeneous sheet was formed. Then 20 grams of powdered phenolic resin [3] was slowly added. Milling was continued until the material was homogeneous and fairly dry. It was stripped off the mill in a continuous sheet.

EXAMPLE 4

A plastic sheet similar to that described in Example 3 was contacted with a sheet of kraft paper which, in turn, was pressed on a sheet of polyethylene. The materials were pressed together for three minutes at 300 p.s.i. at a temperature of 150° C. The resulting product was of permanently bonded laminate of sufficiently good creep resistance to be employed for printing in good register on a Harris (LUH–120) printing press.

The plastic laminate plate material was sensitized by whirling on a solution of Pitman ST coating. When the plate coating had dried, the plate was covered with a screened photographic negative, and exposed for five minutes at two feet with a 15 ampere carbon arc lamp. According to the directions of the manufacturer, the exposed plate was developed with Pitman ST Developer and Pitman ST Developing Ink. Development of the plate in this manner is not necessary with the printing plates of the present invention.

The plate was mounted on a Multilith Model 1250 offset press and excellent printing was obtained.

EXAMPLE 5

Printing plate plastic-base material was prepared in the manner of Example 3 and then calendered to form sheets of uniform thickness of about 8 mils. A sheet of the plastic material was contacted with a sheet of kraft paper which, in turn, was laid on a 10 mil sheet of polyethylene. The materials were pressed between steel plates for two minutes at 300 p.s.i. and a temperature of 140° C. The resultant plate material was sensitized with a 5 percent solution of Hardener No. 3 [4] in water by wiping on the solution.

Plates were mounted on a Multilith Model 1250 offset press, and a Harris (LUH–120) press, and excellent printing was obtained.

In a similar manner to that described in the foregoing examples compositions utilizing novolak resins can be prepared.

What is claimed is:

1. A printing plate base composition consisting essentially of (1) an association product of an ethylene oxide polymer having a molecular weight of from about 50,000 to about ten million and a heat fusible phenolic resin wherein said ethylene oxide polymer is present in an amount of from 0.2 to 3 parts by weight per part phenolic resin, and (2) a non-oxidizing acidic compound wherein said acidic compound is present in an amount of from 2 to 50 weight percent based on the weight of the phenolic resin.

[2] The phonelic used was prepared by refluxing 150 parts of 37 percent Formalin, 100 parts of phenol and 3 parts of sodium hydroxide at 22 inches of vacuum pressure for one and one-half hours. This was followed by the addition of a water slurry containing 1.3 parts of boric acid. The reaction mixture was then dehydrated by distillation under 26 inches of vacuum pressure until the temperature of the reaction mixture increased to 95° C.

[3] The phenolic used was prepared by refluxing 150 parts of 37 percent Formalin, 100 parts of phenol and 3 parts of sodium hydroxide at 22 inches of vacuum pressure for one and one-half hours. This was followed by the addition of a water slurry containing 1.3 parts of boric acid. The reaction mixture was then dehydrated by distillation under 26 inches of vacuum pressure until the temperature of the reaction mixture increased to 95° C.

[4] 4,4′-diazidostilbene-2,2′-disulfonic acid sodium salt; Fairmont Chemical Company, Newark, N.J.

2. The printing plate composition of claim 1, wherein the phenolic resin is phenol-formaldehyde resin.

3. The printing plate composition of claim 1, wherein the phenolic resin is cresol-formaldehyde resin.

4. The printing plate composition of claim 1, wherein the phenolic resin is resorcinol-formaldehyde resin.

5. The printing plate composition of claim 1, wherein the acidic compound is a carboxylic acid.

6. The printing plate composition of claim 5 wherein the carboxylic acid is oxalic acid.

7. A laminate comprising a film of the composition of claim 1 pressed to a substrate material.

8. The laminate of claim 7 wherein said substrate is glass cloth.

9. A printing plate base composition consisting essentially of (1) an association product of an ethylene oxide polymer having a molecular weight of from about 50,000 to about ten million and a heat fusible phenolic resin, wherein said ethylene oxide polymer is present in an amount of from 0.6 to 1.8 parts by weight per part phenolic, and (2) from about 10 to about 25 percent by weight based on the phenolic resin of an nonoxidizing acidic compound.

References Cited

UNITED STATES PATENTS

| | | | |
|---|---|---|---|
| 3,074,897 | 1/1963 | Baker | 260—838 |
| 2,894,931 | 7/1959 | Somerville et al. | 260—838 |
| 3,231,382 | 1/1966 | Silver | 260—838 |
| 3,309,202 | 3/1967 | Silver | 260—838 |

JOHN C. BLEUTGE, Primary Examiner

U.S. Cl. X.R.

96—114; 117—126 GB; 161—93, 192, 198; 252—62.1